United States Patent
Bizet et al.

(10) Patent No.: US 8,878,054 B2
(45) Date of Patent: Nov. 4, 2014

(54) THREE-LAYER FILM FOR A PHOTOVOLTAIC CELL

(75) Inventors: Stephane Bizet, Serquigny (FR); Anthony Bonnet, Beaumont le Roger (FR); Nicolas Devaux, Lyons (FR); Johann Laffargue, Plasnes (FR); Aude Lapprand, Paris (FR)

(73) Assignee: Arkema France, Colombes (FR)

( * ) Notice: Subject to any disclaimer, the term of this patent is extended or adjusted under 35 U.S.C. 154(b) by 527 days.

(21) Appl. No.: 12/532,573

(22) PCT Filed: Feb. 6, 2009

(86) PCT No.: PCT/FR2009/050190
§ 371 (c)(1), (2), (4) Date: Mar. 16, 2010

(87) PCT Pub. No.: WO2009/101343
PCT Pub. Date: Aug. 20, 2009

(65) Prior Publication Data
US 2011/0232735 A1    Sep. 29, 2011

Related U.S. Application Data

(60) Provisional application No. 61/043,229, filed on Apr. 8, 2008.

(30) Foreign Application Priority Data

Feb. 6, 2008  (FR) ..................... 08 50756

(51) Int. Cl.
| | | |
|---|---|---|
| H01L 31/00 | (2006.01) | |
| B32B 27/28 | (2006.01) | |
| B32B 27/08 | (2006.01) | |
| B32B 27/30 | (2006.01) | |
| C08L 27/16 | (2006.01) | |
| C08L 33/12 | (2006.01) | |
| H01L 31/048 | (2014.01) | |

(52) U.S. Cl.
CPC ............. *B32B 27/28* (2013.01); *B32B 27/08* (2013.01); *B32B 27/30* (2013.01); *C08L 27/16* (2013.01); *C08L 33/12* (2013.01); *H01L 31/048* (2013.01); *Y02E 10/50* (2013.01)
USPC .......... 136/256; 428/126; 428/336; 428/323; 428/421

(58) Field of Classification Search
USPC ................. 428/216, 323, 336, 421; 136/256
See application file for complete search history.

(56) References Cited

U.S. PATENT DOCUMENTS

| 5,132,164 A | 7/1992 | Moriya et al. | |
|---|---|---|---|
| 2002/0068175 A1* | 6/2002 | Strassel | 428/421 |

FOREIGN PATENT DOCUMENTS

WO    WO 2007085769    8/2007

OTHER PUBLICATIONS

DuPont Ti-Pure R-960 product catalog, 2002.*
Kynar 4000 HD, online catalog, 1996-2014.*
Kynar 1000 HD, online catalog, 2000.*
Anonymous: "Polyvinyldene fluoride—Typical properties"— Internet Article (Solef & Hylar PVDF) [Online] Xp002891818— Retrieved from the Internet: URL: http://www.solvaysolexis.com/static/wma/dpf/9/2/4/TR-Solef-Hylar.pdf.

* cited by examiner

Primary Examiner — Shane Fang
(74) Attorney, Agent, or Firm — Thomas F. Roland

(57) ABSTRACT

The invention relates to a multilayer film of A/B/C structure comprising: a first layer of composition A, comprising a fluoropolymer; a second layer of composition B, comprising a filled fluoropolymer; and a third layer of composition C, comprising a fluoropolymer, characterized in that the first and third layers have a melting point above 150° C., measured by DSC, and in that the transmittance in visible light is less than 30% for a multilayer film thickness of 25 μm. The invention also relates to the use of a fluoropolymer-based film preferably for a photovoltaic cell back panel, a high-performance textile or a metal, the film adhering to the substrate by means of an adhesive layer placed between the substrate and the film.

16 Claims, No Drawings

THREE-LAYER FILM FOR A PHOTOVOLTAIC CELL

PRIORITY

This application claims benefit, under U.S.C. §119 or §365 of FR 0850756 filed Feb. 6, 2008; U.S. 61/043,229 filed Apr. 8, 2008; and PCT application PCT/FR2009/050190 filed Feb. 6, 2009.

FIELD OF THE INVENTION

The present invention relates to a multilayer film of A/B/C structure based on polymers of vinylidene fluoride (VDF) that can especially be used in the field of photovoltaic cells.

The Technical Problem

Fluoropolymers in general, and in particular the PVDF (polyvinylidene fluoride) polymer due to its very good resistance to adverse weather conditions, to radiation and to chemicals, are used to protect objects and materials. Polymers of VDF are also appreciated for their shiny appearance and their graffiti resistance. All sorts of objects therefore come to be coated with a polymer film based on VDF. However, it is necessary that this film has a very good heat resistance for outside applications subjected to severe climatic conditions (rain, cold, heat) or conversion procedures carried out at high temperature (>130° C.). It is also necessary that the film has good flexibility and good tensile strength so as to withstand the mechanical stresses whilst the film is placed on the object or the material to be covered or once the film is deposited on the object or material—a conventionally used application test consists in tearing a film which has undergone ageing in an oven then seeing if the tear propagates easily or not.

In a photovoltaic cell, protection against the environment is an absolute necessity. For this reason, the rear part of the cell must be protected to prevent degradation of the latter by ultraviolet (UV) rays and moisture penetration. This degradation may consist of oxidation of the film protecting the rear panel of the cell. Moreover, the rear panel of the cell must be an electrical insulator.

Moreover, the film must have bulk thermal stability to prevent thermal expansion and in particular shrinkage during the assembly of the cells. The assembly of the photovoltaic cells is carried out by bonding the various layers using a solvent-based adhesive, followed by lamination. The use of solvents in the adhesives may cause these solvents to penetrate into the film. The assembly of the cells is carried out at high temperature (>130° C.) and optionally using a Corona-type surface oxidation treatment, which is expressed, in particular, by a yellowing and a degradation of the mechanical properties of the fluoropolymer.

The Applicant has developed a structure in the form of a fluoropolymer-based film which has good heat-resistance properties (low volume shrinkage when it is subjected to high temperatures) and also an excellent resistance to the solvents present in the glues and adhesives used for constructing photovoltaic cells, and more particularly the rear panel of the cells. This structure is therefore perfectly suited to protecting the rear panel of photovoltaic cells.

This film has a particular structure of A/B/C type. This structure according to the invention is opaque (low transmission of visible light and of UV rays) and also gives protection against oxygen penetration. The structure retains an attractive film appearance (no yellowing over time).

THE PRIOR ART

Application EP 1 382 640 describes a film having two or three layers based on a homopolymer or copolymer of VDF. The VDF copolymer comprises from 0 to 50 wt % of comonomer. In the examples, only the use of a PVDF homopolymer is described. An organic UV absorber is also specified in the examples.

Application EP 1 566 408 describes a film having two or three layers based on a homopolymer or copolymer of VDF. The VDF copolymer comprises from 0 to 50 wt %, advantageously from 0 to 25 wt % and preferably from 0 to 15 wt % of comonomer. The film does not contain any mineral filler.

International Application WO 20051081859 describes multilayer films based on a fluoropolymer and on an acrylic polymer.

Application US 200510268961 describes a photovoltaic cell protected by a film comprising two fluoropolymer layers, one having a melting point above 135° C., the other having a melting point below 135° C.

Application US 2005/0172997 and U.S. Pat. No. 6,369,316 describe a photovoltaic module protected by a polyvinyl fluoride (PVF) film.

International Application WO 2007/011580 describes polyester-based films for a rear panel of a photovoltaic cell. A layer of polyvinyl fluoride (PVF) may be combined with the polyester film. The rear panel is only evaluated from the point of view of moisture penetration.

None of these documents refer to a multilayer structure having the same characteristics as that of the invention and nothing in these documents enables a person skilled in the art to be led to such a structure.

SUMMARY OF THE INVENTION

The invention relates to a multilayer film of A/B/C structure comprising:
  a first layer of composition A comprising a fluoropolymer;
  a second layer of composition B comprising a filled fluoropolymer; and
  a third layer of composition C comprising a fluoropolymer, characterized in that the first and third layers have a melting point above 150° C. measured by DSC and in that the visible light transmittance is less than 25% for a multilayer film thickness of 25 μm.

Another subject of the invention is the use of this multilayer film in a photovoltaic cell, a technical textile or to cover a metal.

More particularly, the invention relates to a photovoltaic cell whose rear panel is coated with a multilayer film such as described previously.

DETAILED DESCRIPTION

In the description, "between x and y" means that the limits x and y are included.

Advantageously, the first, second and third layers contain from 0.1 to 100 wt % of one or more fluoropolymers, preferably a homopolymer or copolymer of VDF.

The invention relates, more particularly, to a structure in the form of a multilayer film of A/B/C type which comprises:
  a first layer of composition A comprising 100% of a homopolymer or copolymer of VDF;

a second layer of composition B comprising 30 to 75 parts by weight of a homopolymer or copolymer of VDF, from 10 to 45 parts of a homopolymer or copolymer of MMA and from 10 to 25 parts of at least one mineral filler, the total making 100 parts; and a third layer of composition C comprising 100% of a homopolymer or copolymer of VDF.

The term "parts" is understood in the meaning of the invention to be parts by weight.

In the case where the composition A of the first layer is identical to the composition C of the third layer, then the structure is in the form of a symmetrical NB/A multilayer film. The thickness of each of the layers of composition A and C may, independently of one another, and in practice, be between 1 and 30 µm, advantageously between 2 and 20 µm, preferably between 3 and 18 µm and more preferably still between 5 and 15 µm. In one variant of the invention, the thicknesses of the layers of composition A and C are identical.

In another variant of the invention, the compositions A and C of these first and third layers are identical.

The thickness of the layer of composition B is especially between 4 and 45 µm, advantageously between 5 and 40 µm, preferably between 7 and 30 µm and more preferably still between 10 and 25 µm.

Regarding the fluoropolymer, this is prepared by polymerization of one or more monomers of formula (I):

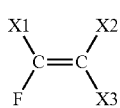

in which:

X1 denotes H or F; and

X2 and X3 denote H, F, Cl, a fluoroalkyl group of formula $C_nF_mH_p—$ or a fluoroalkoxy group $C_nF_mH_pO—$, n being an integer between 1 and 10, m an integer between 1 and (2n+1), p being equal to 2n+1−m.

As examples of monomers that can be used in the invention, mention may be made of hexafluoropropylene (HFP), tetrafluoroethylene (TFE), vinylidene fluoride (VDF, $CH_2=CF_2$), chlorotrifluoroethylene (CTFE), perfluoroalkyl vinyl ethers such as $CF_3—O—CF=CF_2$, $CF_3—CF_2—O—CF=CF_2$ or $CF_3—CF_2CF_2—O—CF=CF_2$, 1-hydropentafluoropropene, 2-hydropentafluoropropene, dichlorodifluoroethylene, trifluoroethylene (VF$_3$), 1,1-dichlorofluoroethylene and mixtures thereof.

The polymerization may also optionally include other unsaturated olefinic monomers that do not comprise fluorine such as ethylene, propylene, butylene and the higher homologues. Diolefins containing fluorine may also be used, for example the diolefins such as perfluorodiallyl ether and perfluoro-1,3-butadiene.

As examples of fluoropolymers, mention may be made of:
homopolymers or copolymers of TFE, especially PTFE (polytetrafluoroethylene), ETFE (ethylene/tetrafluoroethylene copolymer) and also the following copolymers: TFE/PMVE (tetrafluoroethylene/perfluoro(methyl vinyl ether) copolymer), TFE/PEVE (tetrafluoroethylene/perfluoro(ethyl vinyl ether) copolymer), TFE/PPVE (tetrafluoroethylene/perfluoro(propyl vinyl ether) copolymer) and ETTFE/HFP (ethylene/tetrafluoroethylene/hexafluoropropylene terpolymers);
homopolymers or copolymers of VDF, especially PVDF and VDF/HFP copolymers; and
homopolymers or copolymers of CTFE, especially PCTFE (polychlorotrifluoroethylene) and E/CTFE (ethylene/chlorotrifluoroethylene copolymer).

Preferably, the fluoropolymer is a homopolymer or a copolymer of VDF.

Advantageously, the fluoro comonomer copolymerizable with VDF is chosen, for example, from vinyl fluoride; trifluoroethylene (VF3); chlorotrifluoroethylene (CTFE); 1,2-difluoroethylene; tetrafluoroethylene (TFE); hexafluoropropylene (HFP); perfluoro(alkylvinyl ethers) such as perfluoro (methylvinyl ether) (PMVE), perfluoro(ethylvinyl ether) (PEVE) and perfluoro(propylvinyl ether) (PPVE); perfluoro-(1,3-dioxol); perfluoro-(2,2-dimethyl-1,3-dioxol) (PDD), and mixtures thereof.

Preferably, the fluoro comonomer is chosen from chlorotrifluoroethylene (CTFE), hexafluoropropylene (HFP), trifluoroethylene (VF3) and tetrafluoroethylene (TFE), and mixtures thereof.

The comonomer is advantageously HFP as it copolymerizes well with VDF and makes it possible to provide good thermomechanical properties. Preferably, the copolymer only comprises VDF and HFP.

Advantageously, the homopolymer or copolymer of VDF has a viscosity ranging from 100 Pa·s to 3000 Pa·s, the viscosity being measured at 230° C., at a shear rate of 100 s$^{-1}$ using a capillary rheometer. This is because this type of polymer is well suited to extrusion. Preferably, the polymer has a viscosity ranging from 500 Pa·s to 2900 Pa·s, the viscosity being measured at 230° C., at a shear rate of 100 s$^{-1}$ using a capillary rheometer.

Preferably, the fluoropolymer is a homopolymer of VDF (PVDF) or a copolymer of VDF such as VDF/HFP containing at least 50 wt % of VDF, advantageously at least 75 wt % of VDF and preferably at least 90 wt % of VDF. This fluoropolymer specifically has a good chemical resistance, especially to UV rays, and it is usually converted (more easily than in PTFE or in ETFE copolymers) with a view to forming films. Mention may more particularly be made, for example, of the following homopolymers or copolymers of VDF containing more than 75% of VDF and the remainder being HFP: KYNAR® 710, KYNAR® 720, KYNAR® 740, KYNAR FLEX® 2850, KYNAR FLEX® 3120, sold by Arkema.

Regarding the fluoropolymer of composition A and/or of composition C, use is advantageously made of homopolymers of vinylidene fluoride (VDF, $CH_2=CF_2$) (PVDF) and copolymers of VDF preferably containing at least 90 wt % of VDF.

In another variant of the invention, the composition A and C contain PVDF homopolymer.

The Kynar® products from Arkema are particularly recommended, such as, for example, the products from the Kynar® 700 series (VDF homopolymer) or certain Kynar Flex® products (VDF copolymer) that contain less than 5% of randomly distributed comonomers, or less than 10% of comonomers when the copolymer obtained has a heterogeneous or block structure with a melting point above 150° C. These fluoropolymers moreover have the advantage of a higher melting point ranging from 150° C. to 300° C.

Regarding the fluoropolymer of composition B, use is advantageously made of homopolymers of vinylidene fluoride (VDF, $CH_2=CF_2$) (PVDF) and copolymers of VDF preferably containing at least 85 wt % of VDF.

The Kynar® products from Arkema are particularly recommended, such as, for example, the products from the 700 series (VDF homopolymer) or certain Kynar Flex® products (VDF copolymer) containing less than 15 wt % (value included) of comonomer, advantageously less than 13 wt %

(value included) of comonomer, preferably at most equal to 11 wt % and more preferably still at least equal to 10 wt %; and having a melting point above 140° C. and preferably below 300° C.

The comonomer is advantageously HFP as it copolymerizes well with VDF and makes it possible to provide good thermomechanical properties. Preferably, the copolymer only comprises VDF and HFP; the comonomer content varies from 0.5 wt % to 15 wt %, preferably from 3 wt % to 13 wt % and, for example, from 6 to 10 wt %.

The layer of composition B according to the invention contains, in addition to the fluoropolymer, a "filler" which is either in the form of an additional polymer which may be a homopolymer or copolymer of methyl methacrylate (MMA) or in the form of inorganic particles.

This layer of composition B, also called the functional layer, is opaque to UV rays and to visible light. "Opaque" means that the UV ray and visible light transmittance is below a certain value or percentage for a given thickness in comparison with a structure of A/B/C type which does not contain any "fillers", especially mineral fillers, in the composition of the layer B. This A/B/C structure has significant advantages compared to the structures of the prior art in terms of dimensional shrinkage at temperature and the layers of compositions A and C make it possible to protect the layer B from degradation of the fluoropolymer, due to the combined action of the filler, for example mineral filler, oxygen and temperature, or under the action of any Corona-type surface oxidation treatment in the presence of a mineral filler.

Regarding the MMA polymer, use is advantageously made of homopolymers of methyl methacrylate (MMA) and copolymers containing at least 50 wt % of MMA and at least one other monomer copolymerizable with the MMA.

By way of example of a comonomer that is copolymerizable with the MMA, mention may be made, for example, of alkyl(meth)acrylates, acrylonitrile, butadiene, styrene and isoprene. Examples of alkyl(meth)acrylates are described in Kirk-Othmer, Encyclopedia of Chemical Technology, 4th Edition (1991) in Vol. 1, pages 292-293 and in Vol. 16, pages 475-478.

Advantageously, the MMA polymer (homopolymer or copolymer) comprises from 0 to 20 wt % and preferably 5 to 15 wt % of a $C_1$-$C_8$ alkyl(meth)acrylate, which is preferably methyl acrylate and/or ethyl acrylate. The MMA polymer (homopolymer or copolymer) may be functionalized, that is to say that it contains, for example, acid, acid chloride, alcohol or anhydride functional groups. These functional groups may be introduced by grafting or by copolymerization. Advantageously, the functionality is, in particular, the acid functional group provided by the acrylic acid comonomer. It is also possible to use a monomer having two neighbouring acrylic acid functional groups which may be dehydrated to form an anhydride. The proportion of functionality may be from 0 to 15 wt % of the MMA polymer, for example from 0 to 10 wt %.

The MMA polymer may advantageously contain at least one impact modifier. There are commercial grades of MMA polymer that are said to be impact resistant, which contain an acrylic impact modifier in the form of multilayer particles. The impact modifier is then present in the MMA polymer as it is sold (that is to say introduced into the MMA resin during the manufacturing process) but it may also be added during the manufacture of the film. The amount of impact modifier varies from 0 to 30 parts per 70 to 100 parts of MMA polymer, the total making 100 parts.

Impact modifiers of the multilayer particle type, also commonly known as core-shell particles, comprise at least one elastomeric (or soft) layer, that is to say a layer formed from a polymer having a glass transition temperature ($T_g$) below −5° C. and at least one rigid (or hard) layer, that is say formed from a polymer having a $T_g$ above 25° C. The size of the particles is generally less than 1 µm and advantageously between 50 and 300 nm. Examples of impact modifiers in the form of core-shell type multilayer particles will be found in the following documents: EP 1 061 100 A1, US 2004/0030046 A1, FR-A-2446296 or US 2005/0124761 A1. Core-shell type particles that have at least 80 wt % of soft elastomeric phase are preferred.

The MVI (melt volume index) of the MMA polymer may be between 2 and 15 $cm^3$/10 min, measured at 230° C. under a load of 3.8 kg.

The content of MMA polymer in composition B is between 1 and 55 wt %, advantageously between 5 and 50 wt %, preferably between 10 and 45 wt % and more preferably still between 20 and 40 wt %.

Regarding the mineral filler, it is possible to use a metal oxide such as for example titanium dioxide ($TiO_2$), silica, quartz, alumina, a carbonate such as, for example, calcium carbonate, talc, mica, dolomite ($CaCO_3.MgCO_3$), montmorillonite (aluminosilicate), $BaSO_4$, $ZrSiO_4$, $Fe_3O_4$, and mixtures thereof.

The mineral filler has an opacifying function in the UV/visible range. The protective action of the filler is complementary to that of the UV absorber. A $TiO_2$ filler is most particularly preferred from this point of view.

The mineral filler, for example of $TiO_2$ type, acts as solar filters, mainly by scattering/reflection of the UV rays, but also of the visible light, in order to have an opaque film.

The mineral filler may have another function. For example, it may have a flame-retardant function, such as for example antimony oxide ($Sb_2O_3$, $Sb_2O_5$), $Al(OH)_3$, $Mg(OH)_2$, huntite ($3MgCO_3.CaCO_3$), hydromagnesite ($3MgCO_3.Mg(OH)_2.3H_2O$). It may also be an electrically conductive filler (for example, carbon black or else carbon nanotubes).

The filler has a size, expressed as the average diameter, that is generally between 0.05 µm and 1 mm, advantageously between 0.1 µm and 700 µm, preferably between 0.2 µm and 500 µm. The mineral filler content in composition B is between 0.1 and 30 wt %, advantageously between 5 and 28 wt %, preferably between 10 and 27 wt % and more preferably still between 15 and 25 wt %.

Regarding the Fluoropolymer-Based Film

The film based on a fluoropolymer, and more particularly based on a homopolymer or a copolymer of VDF, has a structure of A/B/C type. For example, the structure in film form comprises a first layer of composition A composed of 100 wt % of a VDF homopolymer or copolymer, a second layer of composition B comprising from 30 to 75 parts of at least one VDF homopolymer or copolymer, from 10 to 45 parts of a MMA homopolymer or copolymer and from 10 to 25 parts of at least one mineral filler, the total making 100 parts; and a third layer of composition C composed of 100 wt % of a VDF homopolymer or copolymer Preferably, the VDF homopolymer or copolymer of composition A and/or C is a VDF homopolymer.

The film based on a homopolymer and/or a copolymer of VDF, which protects the substrate therefore comprises, in order starting from the substrate, a layer of composition A or C, a layer of composition B, a layer of composition A or C, the film adhering to the substrate via an adhesive layer.

In the case where the composition A of the first layer is identical to the composition C of the third layer, then the structure is in the form of a symmetrical A/B/A multilayer film.

The thickness of each of the layers of composition A and C may, independently of one another, and in practice, be between 1 and 30 µm, advantageously between 2 and 20 µm, preferably between 3 and 18 µm and more preferably still between 5 and 15 µm. In one variant of the invention, the thicknesses of the layers of composition A and C are identical.

In another variant of the invention, the compositions A and C of these first and third layers are identical.

The thickness of the layer of composition B is especially between 4 and 45 µm, advantageously between 5 and 40 µm, preferably between 7 and 30 µm and more preferably still between 10 and 25 µm.

In the case where the composition A of the first layer is identical to the composition C of the third layer, the multilayer film has a symmetrical A/B/A structure. In this case, the PVDF-based film which protects the substrate therefore comprises, in order starting from the substrate, a layer of composition A, a layer of composition B, a layer of composition A, the film adhering to the substrate via an adhesive layer.

A structure of A/B/A type does not at all imply that the two layers A have the same thickness.

Manufacture of Fluoropolymer-Based Films

The film based on a fluoropolymer and more particularly based on a homopolymer or copolymer of VDF is preferably manufactured by the technique of coextrusion, for example by blow moulding, but it is also possible to use a solvent-processing technique or else by using the coating technique.

[Uses of the Film]

The uses of the film based on a fluoropolymer and more particularly based on a homopolymer or copolymer of VDF, are now described in greater detail.

As a Protective Film for the Back of a Photovoltaic Cell

Photovoltaic cells may be protected at the back by the film based on a fluoropolymer and more particularly based on a homopolymer or copolymer of VDF. A photovoltaic cell makes it possible to convert light energy into electric current. Generally, a photovoltaic cell comprises photovoltaic cells mounted in series and connected together by electrical connection means. The photovoltaic cells are generally mono-junction cells manufactured from polycrystalline silicon P-doped with boron during fusion of the silicon and N-doped with phosphorus on their illuminated surface. These cells are placed in a laminated stack. The laminated stack may consist of EVA (ethylene/vinyl acetate copolymer) covering the photovoltaic cells in order to protect the silicon from oxidation and moisture. The stack is embrocated between a glass plate, which serves as a support on one side, and a film on the other side, for protecting it. The photovoltaic module is thus protected against ageing (UV, salt fog, etc.), scratches, moisture or water vapour.

The cell is generally protected by a multilayer structure sold under the brand in AKASOL® or ICOSOLAR® which is a combination of a TEDLAR® (polyvinyl fluoride or PVF) film and a PET (polyethylene terephthalate) sheet.

The Applicant has found that it is possible to advantageously use, for this application, a structure based on a film or a symmetrical film based on a fluoropolymer and more particularly based on a homopolymer or copolymer of VDF such as defined previously, in place of the TEDLAR® film. This film of A/B/C or A/B/A structure has significant advantages in terms of dimensional shrinkage at temperature and the layers of composition A and C make it possible to protect the functional layer B from degradation of the fluoropolymer under the combined action of the mineral filler, for example of $TiO_2$ type, of oxygen and of temperature; or else of any Corona-type treatment in the presence of mineral filler, for example of $TiO_2$ type.

The dimensional shrinkage should, specifically, be as low as possible during the phase of laminating on the substrate, for example a PET sheet. Also, the dimensional shrinkage should be as low as possible during the assembly of the panels produced at high temperature (140 to 155° C.) under vacuum, this being in order to conserve the structure of the film based on a fluoropolymer and more particularly based on a homopolymer or copolymer of VDF; and especially the thicknesses of each of the layers and therefore the integrity of the mechanical, optical and ageing resistance properties. This property is provided by the A/B/C structure or the symmetrical A/B/A structure (which guarantees film flatness) and by the temperature behaviour of each of the layers that make up the film.

The volume shrinkage of the film at 150° C. is especially less than 2%, advantageously less than 1.5%, preferably less than 1% and more preferably still less than 0.5%.

The presence of a high content of mineral filler, for example of $TiO_2$ type, may lead, under the combined action of temperature, oxygen and UV radiations, to the degradation of a fluoropolymer such as VDF homopolymers or copolymers. This oxidation is especially expressed by yellowing and a degradation of the mechanical properties. The two fluoropolymer layers of composition A and C are therefore necessary in order to protect the functional layer made of composition B not only during the laminating on the substrate (via an adhesive layer) to form the rear panel but also during the assembly of the panel, carried out at high temperature and optionally following a surface oxidation treatment of Corona type.

The layer made of composition A or C located at the rear of the assembled photovoltaic cell additionally provides an increased chemical resistance relative to that of the layer B, and also a better resistance to UV ageing.

The multiplayer film of A/B/C structure according to the invention comprises, for example:
 a first layer of composition A comprising 100 wt % of a VDF homopolymer or copolymer;
 a second layer of composition B comprising 30 to 75 parts of at least one VDF homopolymer or copolymer, from 5 to 45 parts of at least one MMA homopolymer or copolymer and from 10 to 30 parts of at least one mineral filler, the total making 100 parts; and
 a third layer of composition C comprising 100 wt % of a VDF homopolymer or copolymer.

Preferably, the second layer of composition B comprises from 30 to 75 parts of at least one VDF homopolymer or copolymer, from 10 to 45 parts of at least one MMA homopolymer or copolymer and from 10 to 25 parts of at least one mineral filler, the total making 100 parts.

The film described previously (abbreviated to PVDF film) is then laminated on each side of a PET-type substrate, using any type of adhesive and laminating technology known to a person skilled in the art. The final structure of the rear panel of the photovoltaic module is therefore:
 PVDF film/adhesive/PET/adhesive/PVDF film The adhesives which are used by way of example are polyester or polyurethane formulations containing methyl ethyl ketone (MEK) or toluene.

As a Protective Film for Flexible Substrates

The film based on a fluoropolymer and more particularly based on a homopolymer or copolymer of VDF may also be used to protect a flexible substrate such as, for example, a technical textile (made of PVC, glass fabric, glass mat, aramid, Kevlar, etc.). A PVC tarpaulin constitutes an example of a PVC flexible substrate. The film based on a fluoropolymer and more particularly based on a homopolymer or copolymer of VDF may be applied via an adhesive layer using the laminating technique.

The presence of two layers of composition A of a fluoropolymer and more particularly based on a homopolymer or copolymer of VDF protects against degradation of the layer of composition B during the lamination and also gives an increased chemical and UV ageing resistance to the final structure.

As a Protective Film for a Metal Sheet

The film based on a fluoropolymer and more particularly based on a homopolymer or copolymer of VDF may also be used to protect a metal substrate such as for example steel, copper or aluminium. The film based on a fluoropolymer and more particularly based on a homopolymer or copolymer of VDF may be applied via an adhesive layer using the laminating technique.

[Tests]:

UV opacity: the UV opacity was evaluated by absorbance measurements in transmission in the UV spectral range using a spectrophotometer.

Transmittance according to the ASTM D1003 standard: the transmittance measurements in the visible range were carried out using a spectrocolorimeter according to the ASTM D1003 standard with the D65 illuminant and with an angle of 2°. The transmittance values correspond to an average over the spectral range from 400 to 740 nm.

The test of chemical resistance to MEK was carried out according to the EN 438-2:2000 standard. The method consisted in depositing 2 to 3 drops of methyl ethyl ketone onto the film at ambient temperature and of covering it with a watch glass for 16 hours. The watch glass was then removed and the spot was washed with water containing soap and then rinsed with demineralized water. One hour later the cleaning of the spot was examined.

The film was graded according to the following evaluation scale:

Degree 5: No visible change.
Degree 4: Small change in gloss and/or colour only visible under certain angles.
Degree 3: Moderate change in gloss and/or colour.
Degree 2: Large change in gloss and/or colour.
Degree 1: Surface degradation and/or blistering.

Differential scanning colorimetry (DSC) is carried out according to the ISO 11357-3 standard. The thermogram peak obtained indicated the melting point $T_m$, of the respective composition of the layer in the structure. It was taken as an indication of the thermal resistance.

The shrinkage was measured according to the ISO 11501 standard. A 12×12 cm$^2$ square piece of film, in which a 10 cm×10 cm square was drawn, was placed in a ventilated oven at 150° C. for 10 minutes. Next, the dimensions of the frame were again measured. The shrinkage was then evaluated by the variation of each of the dimensions relative to the initial dimension. The value retained was the largest value.

EXAMPLES

Product Used

PVDF-1: PVDF homopolymer in the form of granules with an MFI (melt flow index) of 10 g/10 min (230° C./12.5 kg), having a viscosity of 1900 mPa·s at 230° C./100 s$^{-1}$ and a melting point of 165° C.

PVDF-2: VDF/HFP copolymer in the form of granules (11 wt % HFP) with an MFI of 5 g/10 min (230° C./12.5 kg), having a viscosity of 2500 mPa·s at 230° C./100 s$^{-1}$ and a melting point of 142° C.

PVDF-3: VDF/HFP heterogeneous copolymer in the form of granules (10 wt % HFP) with an MFI of 5 g/10 min (230° C./12.5 kg), having a viscosity of 2300 mPa·s at 230° C./100 s$^{-1}$ and a melting point of 163° C.

PVDF-4: VDF/HFP copolymer in the form of granules (17 wt % HFP) with an MFI of 10 g/10 min (230° C./12.5 kg), having a viscosity of 2200 mPa·s at 230° C./100 s$^{-1}$ and a melting point of 135° C.

PMMA: OROGLAS® BS8 from Altuglas International with an MFI of 4.5 g/10 min (230° C./3.8 kg) in pearl form containing a comonomer, methyl acrylate in an amount of 6 wt %. This PMMA did not contain an impact modifier.

$TiO_2$: Ti-Pure® R 960 titanium dioxide from DuPont was used. The average diameter of the particles according to the supplier was 0.5 µm.

Example 1

According to the Invention

An A/B/A three-layer film was composed of:
a 5 µm thick layer containing 100% of PVDF-1; and
a 20 µm thick layer containing 60 wt % of PVDF-2, 24 wt % of PMMA and 16 wt % of $TiO_2$; and
a 5 µm thick layer containing 100 wt % of PVDF-1.

Example 2

According to the Invention

An A/B/A three-layer film was composed of:
a 5 µm thick layer containing 100% of PVDF-1; and
a 20 µm thick layer containing 60 wt % of PVDF-1, 24 wt % of PMMA and 16 wt % of $TiO_2$; and
a 5 µm thick layer containing 100 wt % of PVDF-1.

Example 3

According to the Invention

An A/B/A three-layer film was composed of:
a 5 µm thick layer containing 100% of PVDF-1; and
a 20 µm thick layer containing 60 wt % of PVDF-3, 24 wt % of PMMA and 16 wt % of $TiO_2$; and
a 5 µm thick layer containing 100 wt % of PVDF-1.

Example 4

According to the Invention

An A/B/A three-layer film was composed of:
a 5 µm thick layer containing 100% of PVDF-1; and
a 15 µm thick layer containing 50 wt % of PVDF-3, 30 wt % of PMMA and 20 wt % of $TiO_2$; and
a 5 µm thick layer containing 100 wt % of PVDF-1.

Example 5

According to the Invention

An NB/A three-layer film was composed of:
a 5 µm thick layer containing 100% of PVDF-1; and a 15 μm thick layer containing 40 wt % of PVDF-3, 36 wt % of PMMA and 24 wt % of TiO$_2$; and
a 5 μm thick layer containing 100 wt % of PVDF-1.

Example 6

According to the Invention

An A/B/A three-layer film was composed of:
a 5 μm thick layer containing 100% of PVDF-1; and
a 20 μm thick layer containing 40 wt % of PVDF-3, 36 wt % of PMMA and 24 wt % of TiO$_2$; and
a 5 μm thick layer containing 100 wt % of PVDF-1.

Example 7

According to the Invention

An A/B/A three-layer film was composed of:
an 8 μm thick layer containing 100% of PVDF-1; and
a 20 μm thick layer containing 60 wt % of PVDF-3, 24 wt % of PMMA and 16 wt % of TiO$_2$; and
an 8 μm thick layer containing 100 wt % of PVDF-1.

Example 8

Comparative Example

A two-layer film was composed of:
a 10 μm thick layer containing 100% of PVDF-1; and
a 20 μm thick layer containing 60 wt % of PVDF-2, 24 wt % of PMMA and 16 wt % of TiO$_2$.

Example 9

Comparative Example

An A/B/C three-layer film was composed of:
a 10 μm thick layer containing 100% of PVDF-1; and
a 20 μm thick layer containing 60 wt % of PVDF-2, 24 wt % of PMMA and 16 wt % of TiO$_2$; and
a 5 μm thick layer containing 30 wt % of PVDF-2 and 70 wt % of PMMA.

Example 10

Comparative Example

An A/B/C three-layer film was composed of:
a 5 μm thick layer containing 100% of PVDF-1; and
a 20 μm thick layer containing 60 wt % of PVDF-2, 24 wt % of PMMA and 16 wt % of TiO$_2$; and
a 5 μm thick layer containing 100% of PVDF-4.

Example 11

According to the Invention

An A/B/A three-layer film was composed of:
a 5 μm thick layer containing 100% of PVDF-1; and
a 30 μm thick layer containing 60 wt % of PVDF-3, 24 wt % of PMMA and 16 wt % of TiO$_2$; and
a 5 μm thick layer containing 100 wt % of PVDF-1.

Example 12

According to the Invention

An A/B/A three-layer film was composed of:
a 5 μm thick layer containing 100% of PVDF-1; and
a 10 μm thick layer containing 60 wt % of PVDF-3, 24 wt % of PMMA and 16 wt % of TiO$_2$; and
a 5 μm thick layer containing 100 wt % of PVDF-1.

The films from these examples have the following properties:

In the case where the composition A of the first layer was identical to the composition C of the third layer, the thermal resistance is only shown for composition A.

| Example | UV opacity ARKEMA method | Transmittance [%] ASTM D1003 (ill. D65) | Chemical resistance to MEK EN 438-2 | Thermal resistance of the film DSC ISO 11357-3 (20° C./min) $T_m(A)$ [° C.] | | $T_m(B)$ [° C.] | $T_m(C)$ [° C.] | Film shrinkage at 150° C. [%] ISO 11501 |
|---|---|---|---|---|---|---|---|---|
| 1 | ++ | 19 | 4 | 165 | | 142 | — | <1 |
| 2 | ++ | 18 | 4 | 165 | | 167 | — | <0.5 |
| 3 | ++ | 19 | 4 | 165 | | 162 | — | <0.5 |
| 4 | + | 23 | 4 | 165 | | 160 | — | <0.5 |
| 5 | ++ | 21 | 4 | 165 | | 158 | — | <0.5 |
| 6 | ++ | 17 | 5 | 166 | | 162 | — | <0.5 |
| 7 | +++ | 16 | 4 | 165 | | 158 | — | <0.5 |
| Comp. 8 | ++ | 19 | 1 (a) | 167 | | 142 | — | 5 |
| Comp. 9 | ++ | 18 | 1 (b) | 167 | | 142 | NA (c) | 5 |
| Comp. 10 | ++ | 19 | 2 (b) | 165 | | 142 | 135 | 2 |
| 11 | +++ | 13 | 4 | 169 | | 167 | — | <0.5 |
| 12 | + | 24 | 4 | 169 | | 167 | — | <0.5 |

(a) The chemical resistance was measured on the layer B side
(b) The chemical resistance was measured on the layer C side
(c) No enthalpy fusion, the glass transition was measured at 50° C. (according to ISO 11357-2)

The structures in the form of A/B/A films in the examples according to the invention have very good chemical resistance and low shrinkage (dimensional stability of the film) at 150° C.

The invention claimed is:
1. Multilayer film of A/B/C structure comprising:
a first layer of composition A consisting of a homopolymer or copolymer of vinylidene fluoride (VDF);
a second layer of composition B comprising 30 to 75 parts by weight of a homopolymer or copolymer of VDF, from

5 to 45 parts of a homopolymer or copolymer of methyl methacrylate (MMA), and from 10 to 30 parts of at least one mineral filler, the total making 100 parts; and a third layer of composition C consisting of a homopolymer or copolymer of vinylidene fluoride (VDF), wherein the first and third layers can be of the same or different composition have a melting point above 150° C. measured by DSC and in that the visible light transmittance is less than 25% for a multilayer film thickness of 25 µm, and wherein either the first layer, the third layer, or both the first and third layers comprises 100 wt % of at least one fluoropolymer.

2. Multilayer film according to claim 1, wherein the volume shrinkage of the film at 150° C. is less than 1%.

3. Multilayer film according to claim 1, wherein said homopolymer or copolymer of VDF of the first and/or third layers is a homopolymer of VDF.

4. Multilayer film according to claim 1, wherein said homopolymer or copolymer of VDF of the second layer contains less than 15 wt % (value included) of comonomer.

5. Multilayer film according to claim 1, wherein said homopolymer or copolymer of VDF of the second layer has a melting point above 140° C. measured by DSC.

6. Multilayer film according to claim 1, wherein the filler of the second layer contains at least one filler selected from the group consisting of TiO$_2$, calcium carbonate, silica, quartz, alumina, talc and mica.

7. Multilayer film according to claim 1, wherein the filler content in the composition B is between 0.1 and 30 wt %.

8. Multilayer film according to claim 1, wherein the size of the filler is between 0.05 µm and 1 mm.

9. Multilayer film according to claim 1, wherein said homopolymer or copolymer of VDF of the second layer is a copolymer of VDF.

10. Multilayer film according to claim 1, wherein the thickness of each of the layers of composition A and C is, independently of one another, between 1 and 30 µm.

11. Multilayer film according to claim 1, wherein the thickness of the layer of composition B is between 4 and 45 µm.

12. A structure comprising the multilayer film according to claim 1, wherein said multilayer film comprises a surface layer of a photovoltaic cell, a technical textile or a metal.

13. The structure of claim 12, wherein said structure is a photovoltaic cell, and wherein said photovoltaic cell comprises, in the rear panel of said assembled cell said multilayer film.

14. Multilayer film according to claim 4, wherein the homopolymer or copolymer of VDF of the second layer contains less than or equal to 11 wt % (value included) of comonomer.

15. Multilayer film according to claim 10, wherein the thickness of each of the layers of composition A and C is, independently of one another, between 3 and 18 µm.

16. Multilayer film according to claim 11, wherein the thickness of the layer of composition B is between 7 and 30 µm.

* * * * *